(12) United States Patent
Forbes

(10) Patent No.: US 7,317,310 B2
(45) Date of Patent: Jan. 8, 2008

(54) EMBEDDED PCB IDENTIFICATION

(75) Inventor: Brian S. Forbes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/954,402

(22) Filed: Sep. 11, 2001

(65) Prior Publication Data

US 2003/0047350 A1 Mar. 13, 2003

(51) Int. Cl.
G01R 31/26 (2006.01)
(52) U.S. Cl. ............... 324/158.1; 324/765; 324/763
(58) Field of Classification Search ............ 324/158.1, 324/765; 340/10.1, 10.42, 693.5; 235/492, 235/488, 487; 361/861
See application file for complete search history.

(56) References Cited

U.S. PATENT DOCUMENTS

| | | | | |
|---|---|---|---|---|
| 4,457,798 A | * | 7/1984 | Hoppe et al. | 156/248 |
| 4,563,575 A | * | 1/1986 | Hoppe et al. | 235/492 |
| 4,841,134 A | * | 6/1989 | Hida et al. | 235/488 |
| 5,051,895 A | * | 9/1991 | Rogers | 717/168 |
| 5,381,596 A | * | 1/1995 | Ferro | 29/600 |
| 5,724,234 A | * | 3/1998 | Phelps | 361/816 |
| 5,995,006 A | * | 11/1999 | Walsh | 340/572.7 |
| 6,091,332 A | * | 7/2000 | Eberhardt et al. | 340/572.1 |
| 6,118,379 A | * | 9/2000 | Kodukula et al. | 340/572.8 |
| 6,157,546 A | * | 12/2000 | Petty et al. | 361/816 |
| 6,161,205 A | * | 12/2000 | Tuttle | 714/724 |
| 6,204,764 B1 | * | 3/2001 | Maloney | 340/568.1 |
| 6,215,402 B1 | * | 4/2001 | Rao Kodukula et al. | 340/572.8 |
| 6,331,782 B1 | * | 12/2001 | White et al. | 324/763 |
| 6,472,612 B2 | * | 10/2002 | Fartash et al. | 174/260 |
| 6,714,121 B1 | * | 3/2004 | Moore | 340/10.3 |
| 6,732,158 B1 | * | 5/2004 | Hesselink et al. | 709/208 |
| 6,793,127 B2 | * | 9/2004 | Alsafadi et al. | 235/375 |
| 6,803,655 B2 | * | 10/2004 | Fujio et al. | 257/724 |
| 2001/0006368 A1 | * | 7/2001 | Maloney | 340/568.1 |

FOREIGN PATENT DOCUMENTS

JP 2004111518 A * 4/2004

* cited by examiner

*Primary Examiner*—Paresh Patel
(74) *Attorney, Agent, or Firm*—Rob Anderson; Intel Corporation

(57) ABSTRACT

A method of tracking a printed circuit board is described. An embedded identification device is utilized. The embedded identification device is placed in a layer of the printed circuit board. An external transceiver is used to communicate with the embedded device and record platform information.

18 Claims, 7 Drawing Sheets

EMBEDDED PCB IDENTIFICATION

FIELD OF THE INVENTION

The present invention pertains to the field of printed circuit boards. More particularly, the present invention relates to a method to track printed circuit boards via the placement and recording of bar code labels.

BACKGROUND OF THE INVENTION

A printed circuit board (PCB) typically consists of one or more layers of conductive circuitry supported and separated by a dielectric material. Thus, printed circuit boards have outer layers and inner layers. The outer layers of a PCB are usually used for component placement and test pins.

A motherboard, or back plane, is an example of a printed circuit board (PCB). Components such as modules, connectors, subassemblies, and other printed circuit boards are often mounted on a motherboard. Interconnections on the motherboard are made utilizing traces on the board. The inner layers of a PCB also have circuitry. Plated vias are used to connect circuitry on different layers of the PCB.

The flowchart of a typical PCB build process is demonstrated in FIG. 1. Once the build process is initiated as shown in operation 100, the first phase, operation 110, involves designing the PCB. The design operation 110 involves building prototypes and is usually done using computed aided design (CAD) tools. The prototypes are then tested and evaluated in the next phase, operation 120, until the PCB meets all the design specifications. Once testing is completed, production begins in operation 130. Production typically includes processing the inner layer, processing additional layers, compressing or laminating the different layers together, drilling via holes, processing the outer layers, and adding components either manually or by machines. Following production, the board is reflowed or baked in operation 140. Then connectors are added in operation 150 and the back of the board is wave soldered in operation 160. Wave soldering is a process where an assembled PCB is brought in contact with a continuously flowing and circulating mass of solder. Once the board is completed, an adhesive identification label is added in operation 170. Finally, the board is tested again for functionality in operation 180.

A PCB typically consists of layers of fiberglass sheet laminated with etched copper patterns. FIG. 2 shows an example of a four layer PCB stackup. The four layers consist of two signal layers (layers 210 and 270), one power layer 230, and one ground layer 250. The signal layers 210 and 270 are conductive layers. The power and ground layers 230 and 250 help define the voltages delivered to the components added to the PCB.

A core layer 240 is sandwiched between the power layer 230 and ground layer 250. Unlike the signal layers 210 and 270, the core layer 240 is generally an insulating layer of dielectric material with copper adhered to both sides. The copper is used to form conductive circuits. The core material can be rigid or flexible.

A prepreg layer 220 exists between the signal layer 210 and the power layer 230. Similarly a prepreg layer 260 exists between the ground layer 250 and the signal layer 270. The prepreg layers 220 and 260, also known as the pre-impregnated layers, consist of the core material impregnated with a synthetic resin partially cured to an intermediate stage. The prepreg layers 220 and 260 are used to bond two materials together. Like the core layer 240, the prepreg layers 220 and 260 are insulating layers.

As previously stated, components are added to the PCB during the production phase of the PCB build process. FIG. 3 shows an example of a PCB 300 with placed components. In order to track the PCB, a bar code 310 is placed on the PCB along with other components such as the central processing unit (CPU) 320, rear I/O 330, expansion slots 340, and memory slots 350.

The bar code 310 is an adhesive label that is recorded and manually placed on the PCB 300. The bar code 310 is then manually tracked using a bar code scanner. The bar code label 310, however, must be placed in a component free area to ensure clearance for other components to be placed on the PCB 300.

Moreover, the bar code label 310 is typically required to be placed a pre-specified minimum distance from timing critical signals and busses to prevent possible performance degradation. The bar code label 310 can alter the impedance of traces on the PCB 300. Thus, the bar code label 310 is typically placed in low speed areas of the board 300.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
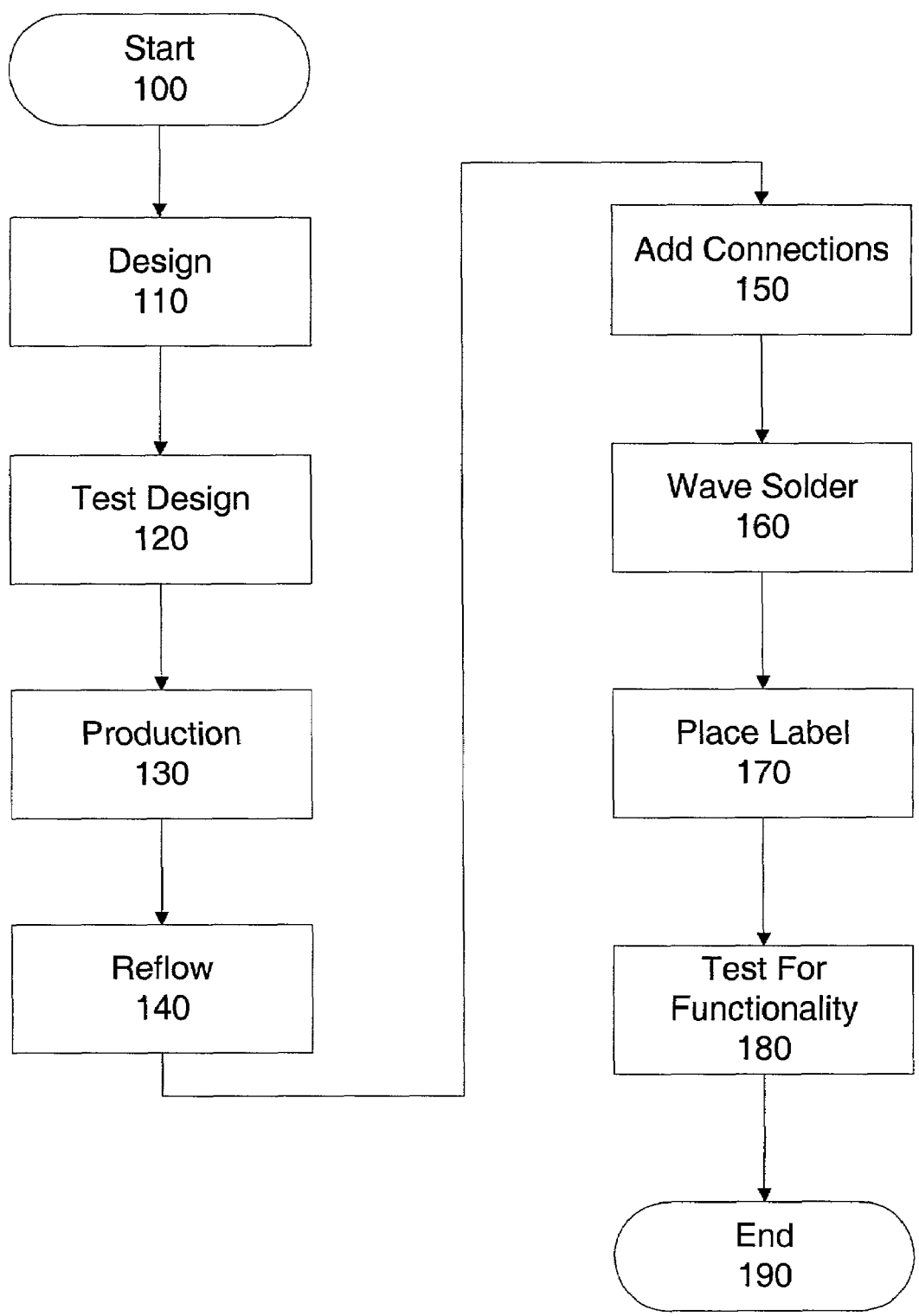
FIG. 1 shows a flowchart of a typical PCB build process.
Figure 2:
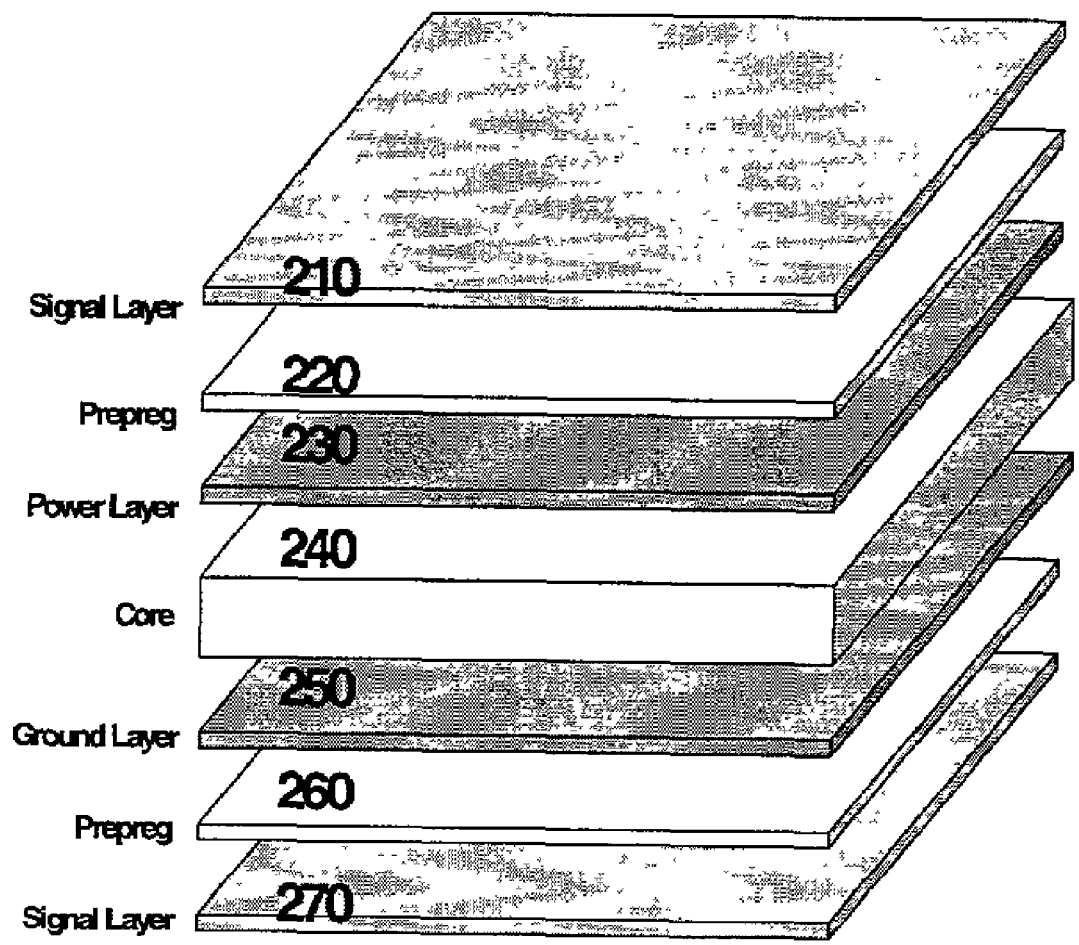
FIG. 2 shows a 4-layer PCB stackup.
Figure 3:
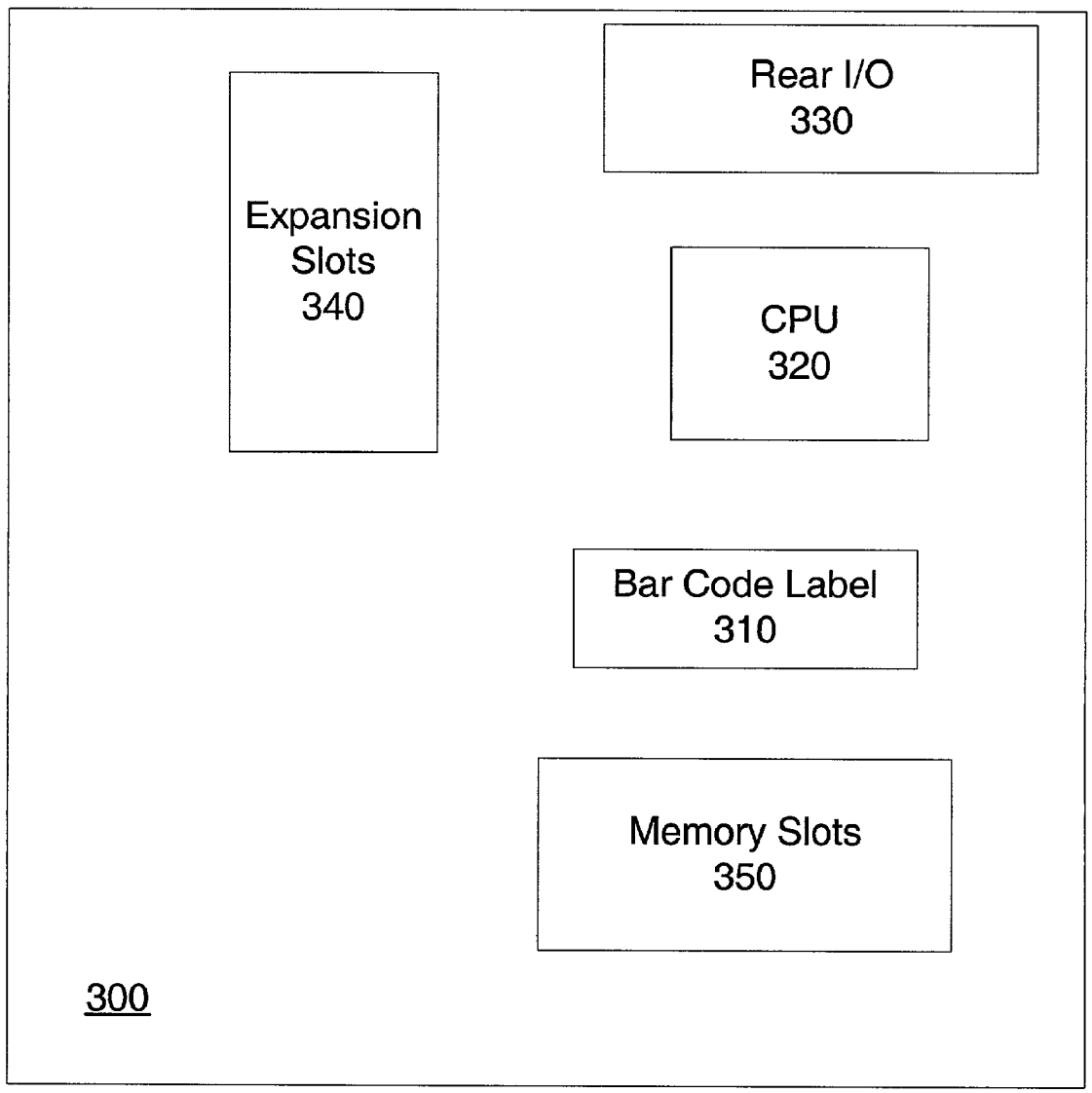
FIG. 3 shows a platform with a PCB identification label.
Figure 4:
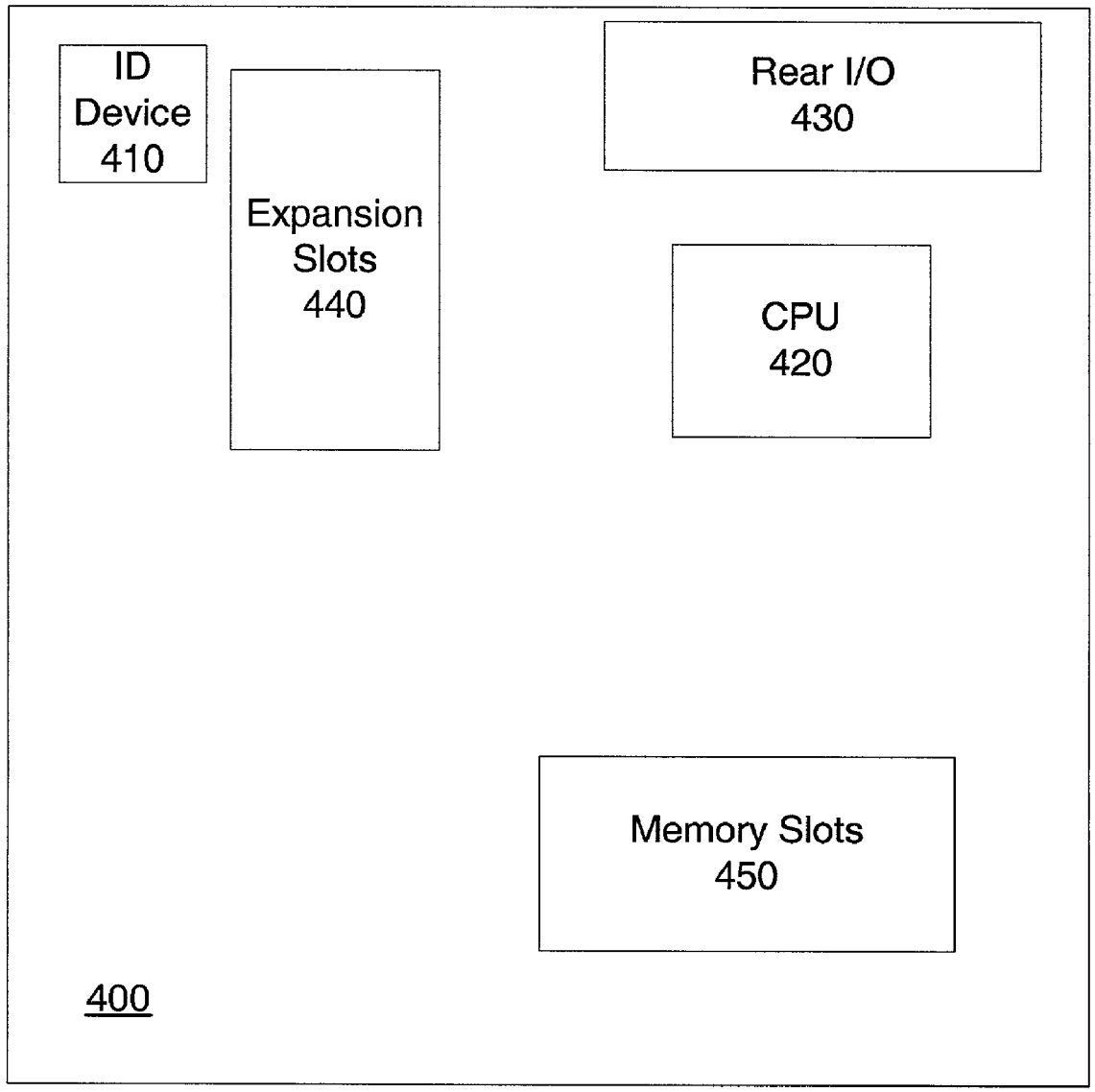
FIG. 4 shows an embedded identification device on a chip.

An embedded PCB device eliminates both the need for manual tracking of individual platforms and the placement of identification labels on the PCB. One embodiment of the invention is depicted in FIG. 4. In this embodiment, the embedded PCB device 410 is a passive radio frequency (RF) device.

Components of the PCB 400 in FIG. 4 include the CPU 420, rear I/O 430, expansion slots 440, and memory slots 450. The passive RF device 410 is also included on the PCB 400 to improve the manufacturability of the platforms. The embedded identification device 410 eliminates the need for manually placing an adhesive identification label on each PCB following the PCB manufacturing process. A manually placed bar code label typically requires precise alignment since an empty area is reserved on the PCB for the label. The embedded identification device 410 eliminates bar code alignment issues because the embedded identification device 410 is built into the manufacturing process. Moreover, including the embedded identification device 410 in the manufacturing process improves efficiency since bar code labels no longer need to be manually placed. As a result, the embedded identification device 410 improves the manufacturability of the PCB 400.

In addition to improving manufacturability, the passive RF device 410 is useful for tracking, testing, security, and sorting purposes. Each PCB 400 is usually continuously tracked throughout the PCB manufacturing process. Thus, each PCB is tracked from the time it is a bare board all the way through the process until the PCB is a completed motherboard. The embedded passive RF device 410 eliminates the need for manually tracking each PCB 400 with a bar code scanner.

The embedded passive RF device 410 also eliminates problems associated with dusty or dirty bar code labels and scanners. Dusty or dirty bar code labels and scanners can cause tracking problems. Therefore, the embedded identification device 410 eliminates the tracking problems associated with bar codes and enables tracking a plurality of printed circuit boards at approximately the same time. An external RF transceiver is used to communicate with and track the printed circuit boards throughout the manufacturing process. The transceiver transmits and decodes data to the PCB 400.

Testing information is stored in the identification device 410 and helps ensure that the PCB is functional throughout the PCB manufacturing process. PCB fabrication information is maintained in the testing feature. Similar to tracking information, testing information is communicated with the PCB 400 using an external RF transceiver.

The embedded identification device 410 is also used for security purposes. Traditional bar code labels are easily modified. The embedded device 410 reduces the risk of counterfeited platforms since the embedded device 410 is located in a layer of the PCB.

In addition, the embedded device 410 is useful for sorting completed boards. In an automated manufacturing system, information regarding what components have been placed on each PCB 400 is stored in the embedded device. The completed motherboards are then grouped with other boards with like components. The PCB sorting information is communicated with the external RF transceiver.

The embedded identification device 410 can be placed anywhere on the PCB. In this particular instance, the identification device 410 is placed on the northwest corner of the PCB. The RF device does not have minimum spacing requirements from other components.

In a second embodiment of the invention, the embedded PCB device 410 is a nonvolatile memory. The nonvolatile memory is used to store the identification information of the PCB. One example of a nonvolatile memory used in this embodiment of the invention is a flash electrically erasable programmable read only memory (EEPROM).

In a third embodiment of the invention, transceivers such as computer laptops, cellular phones, and other electronics are used to transmit and decode information to the embedded identification device 410.

Figure 5:
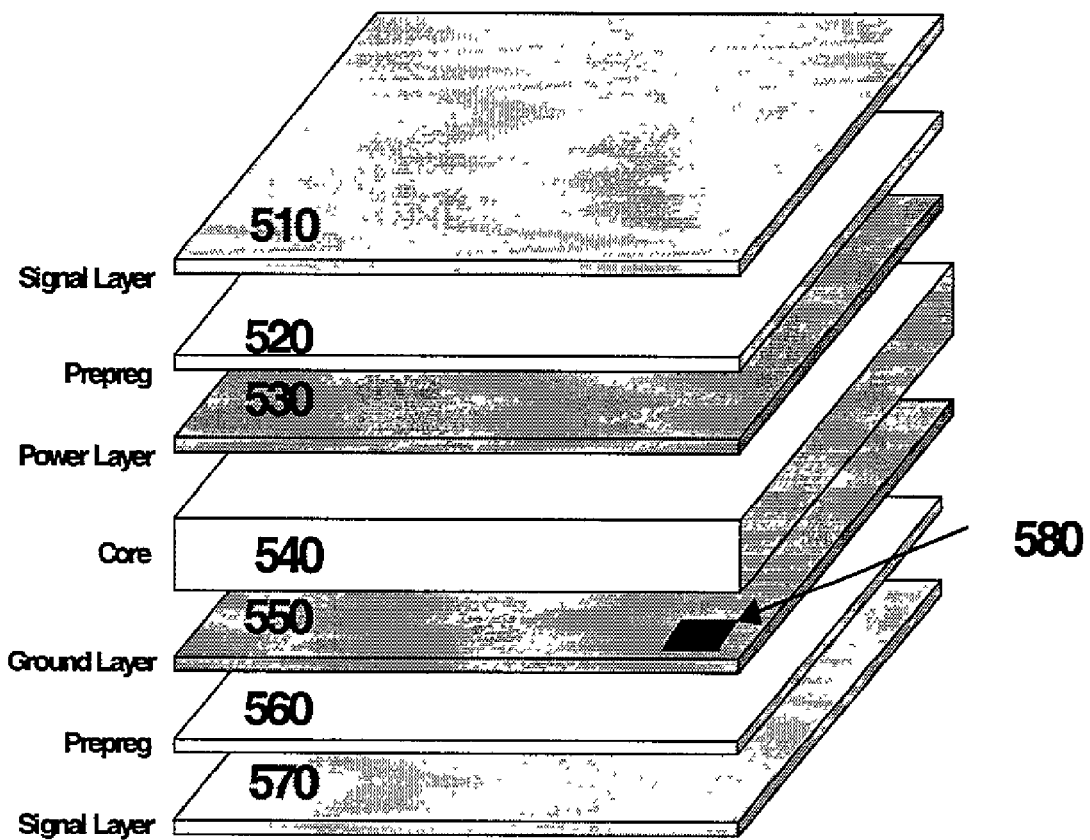
FIG. 5 shows a 4-layer PCB stackup with an embedded identification device.

FIG. 5 shows a four layer PCB stackup with an embedded identification device. The four layers consist of two signal layers 510 and 570, one power layer 530, and one ground layer 550. The signal layers 510 and 570 are conductive layers. The power layer 530 and ground layer 550 help define the voltages delivered to the components added of the PCB. The embedded identification device 410 as shown in FIG. 4 is placed in a footprint 580 outlined in the ground layer 550. A core layer 540 is sandwiched between the power layer 530 and ground layer 550.

Unlike the signal layers 510 and 570, the core layer 540 is an insulating layer of dielectric material with copper adhered to both sides. The copper is used to form conductive circuits. The core material can be rigid or flexible. A prepreg layer 520 exists between the signal layer 510 and the power layer 530. Similarly, a prepreg layer 560 exists between the ground layer 550 and the signal layer 570.

Figure 6:
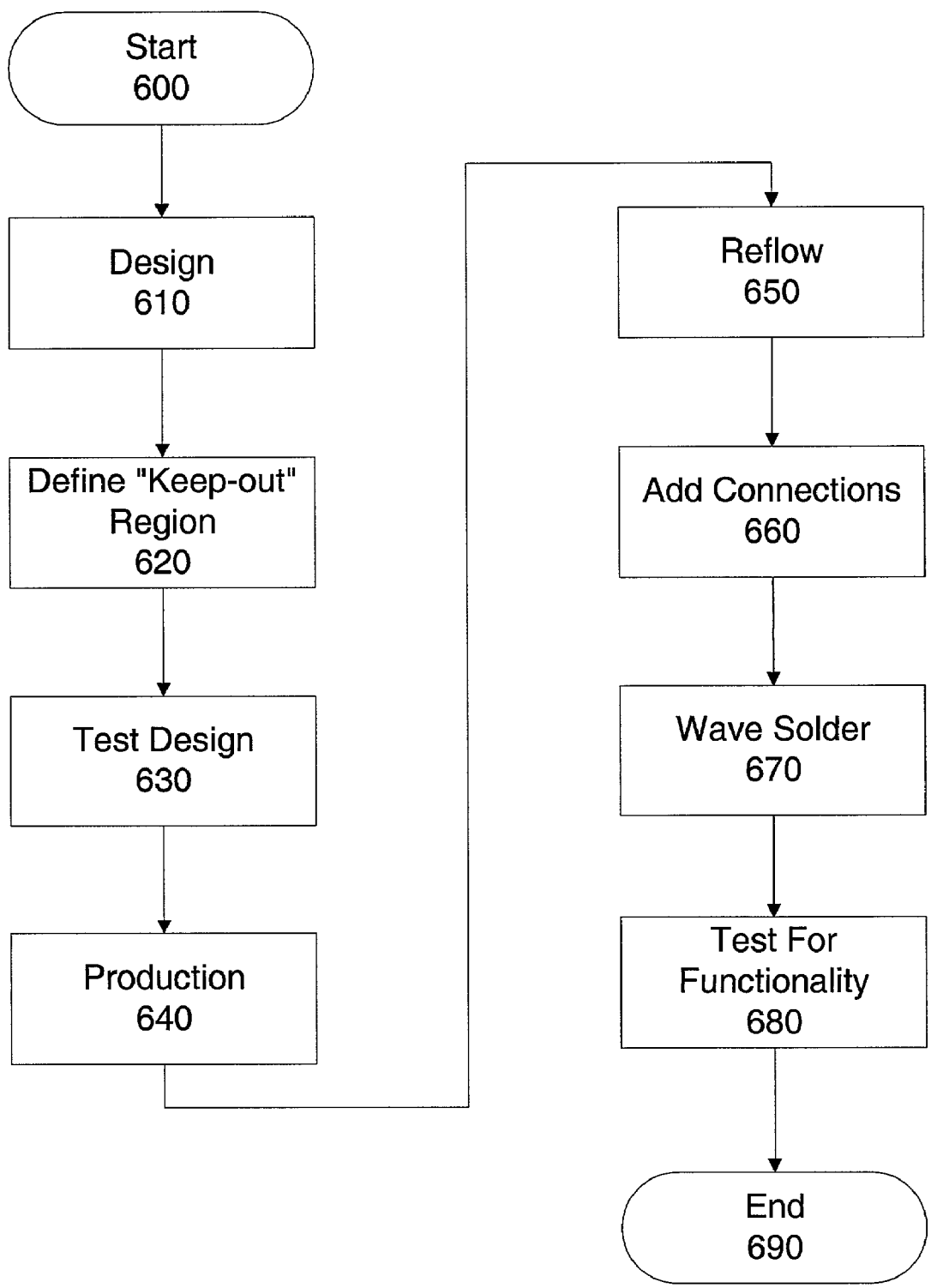
FIG. 6 shows a flowchart of a build process for a PCB with an embedded identification device.

In order to create the footprint 580 for the embedded identification device, the device land pattern must be defined during the design process. FIG. 6 shows a flowchart of an embodiment of a build process of a PCB with an embedded identification device. Following the initiating phase of operation 600, the PCB is designed in operation 610. During the design phase of operation 610, an internal land pattern for the PCB is placed in the appropriate layers of the PCB board file. In one embodiment of the invention, the internal land pattern is placed in the ground layer 550. The device land pattern accounts for reflowing and wave soldering during the normal platform build in manufacturing by outlining an approximately 300 mil corner keep-out as depicted in operation 620. The defined keep-out region helps to minimize the possibility of thermal damage during the reflow and wave solder processes. Once the keep-out region has been defined, the design is tested in operation 630.

If the design passes the tests of operation 630, production begins in operation 640. Production includes the processing the inner layer, processing additional layers, compressing or laminating the different layers together, drilling via holes, processing the outer layers, and adding components either manually or by machines. Following production, the board is reflowed in operation 650. The connectors are added in operation 660 and the back of the board is wave soldered in operation 670. Once the board is completed, the board is tested again for functionality in operation 680.

Figure 7:
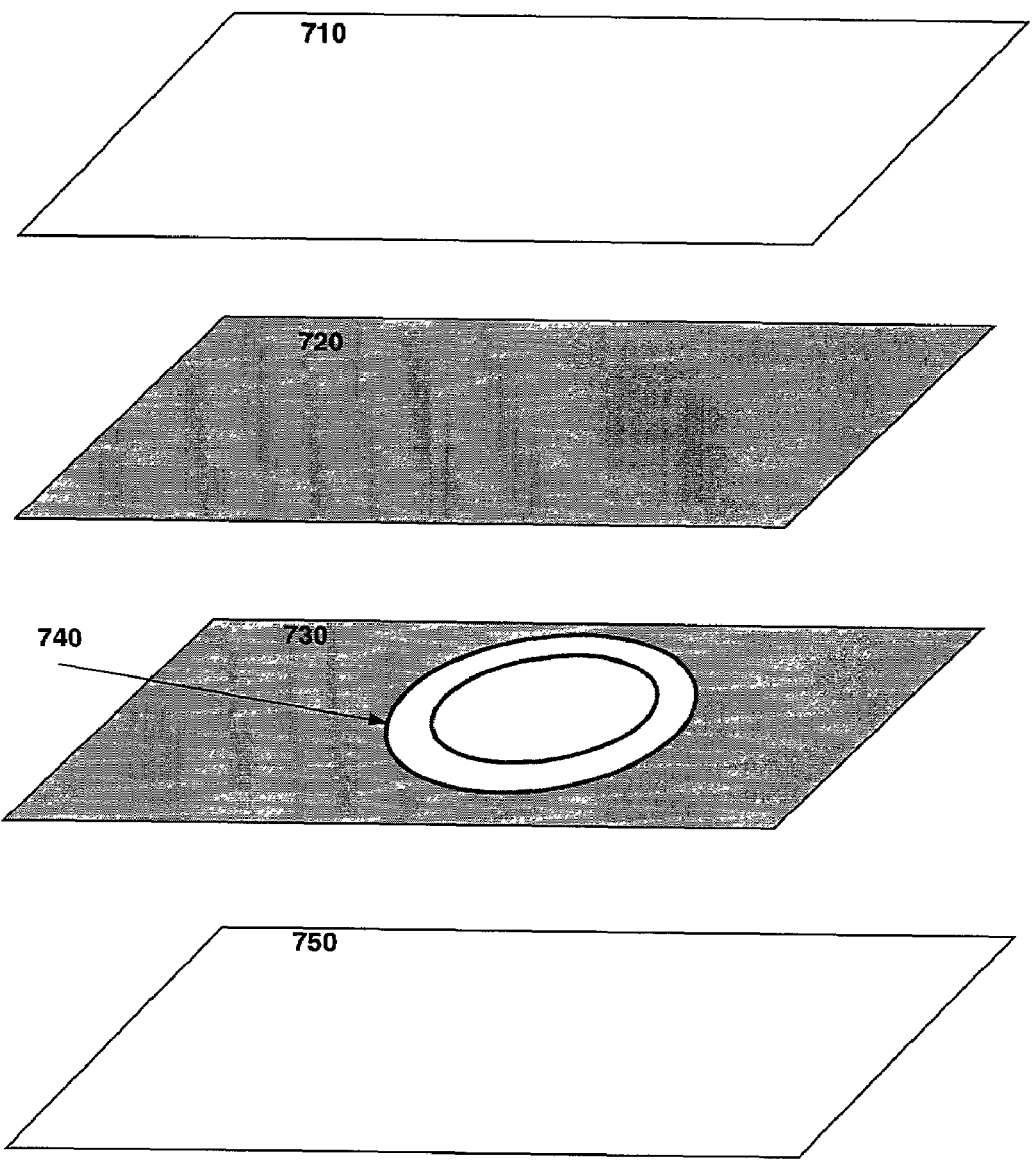
FIG. 7 shows a diagram of a 4-layer PCB stackup with a void for the embedded identification device.

FIG. 7 shows the four layers of a four layer board stackup. Layer 710 is the first signal layer; layer 720 is the power layer; layer 730 is the ground layer; and layer 750 is the second signal layer. Also included in FIG. 7 is the footprint 740 in the ground layer 730 for the embedded identification device. As previously stated, the power and ground layers 720 and 730 are conductive layers. In one embodiment of the invention, the power and ground layers 720 and 730 are composed of copper. In contrast, the footprint 740 is a non-conducting material.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A method of testing a printed circuit board, comprising:
   placing an integrated circuit in a layer of the printed circuit board;
   communicating testing information to the integrated circuit in the printed circuit board using a radio frequency signal transmitted by a transceiver;
   communicating sorting information to the integrated circuit in the printed circuit board using a radio frequency signal transmitted by the transceiver, wherein the sorting information comprises a list of components of the printed circuit board; and
   grouping the printed circuit board with other printed circuit boards having like components.

2. The method of claim 1, wherein testing information is stored in the integrated circuit.

3. The method of claim 1, wherein the layer of the printed circuit board is a ground layer of the printed circuit board.

4. A method of tracking a printed circuit board, comprising:
- placing a programmed integrated circuit in a layer of the printed circuit board;
- tracking the printed circuit board during manufacturing with an external transceiver, wherein the printed circuit board is tracked with a radio frequency signal;
- communicating sorting information to the integrated circuit in the printed circuit board using a radio frequency signal, wherein the sorting information comprises a list of components of the printed circuit board; and
- grouping the printed circuit board with other printed circuit boards having like components.

5. The method of claim 4, further comprising recording the printed circuit board information using software.

6. The method of claim 4, wherein the printed circuit board is a four-layer printed circuit board.

7. The method of claim 4, wherein the integrated circuit is programmed with a part number.

8. The method of claim 4, wherein the integrated circuit is placed in a northwest corner of the printed circuit board.

9. The method of claim 4, wherein the integrated circuit is a passive radio frequency device.

10. The method of claim 4, wherein the integrated circuit is a flash memory.

11. The method of claim 10, wherein the flash memory is a flash electrically erasable read only memory.

12. The method of claim 4, wherein the printed circuit board is tracked using a computer laptop transceiver.

13. The method of claim 4, wherein the printed circuit board is tracked using a cellular phone transceiver.

14. The method of claim 4, wherein the layer of the printed circuit board is a ground layer of the printed circuit board.

15. An apparatus comprising:
- means for storing a printed circuit board identification number in a layer of the printed circuit board;
- means for tracking platform information of the printed circuit board from a bare board state to a completed motherboard state;
- means for communicating sorting information with an external transceiver, wherein the sorting information comprises a list of components of the printed circuit board; and
- means for grouping the printed circuit board with other printed circuit boards having like components.

16. The apparatus of claim 15 further comprising an integrated circuit to record the printed circuit board information.

17. The apparatus of claim 15 further comprising a means for testing the printed circuit board.

18. The apparatus of claim 15, wherein the layer of the printed circuit board is a ground layer of the printed circuit board.

* * * * *